United States Patent
Chang et al.

(10) Patent No.: US 6,319,850 B1
(45) Date of Patent: Nov. 20, 2001

(54) METHOD OF FORMING DIELECTRIC LAYER WITH LOW DIELECTRIC CONSTANT

(75) Inventors: Yih-Jau Chang, Hsinchu; Chen-Chung Hsu, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/294,541

(22) Filed: Apr. 19, 1999

(51) Int. Cl.[7] .......................... H01L 21/31; H01L 21/469
(52) U.S. Cl. .............................. 438/763; 438/515
(58) Field of Search .................... 438/619, 694, 438/725, 763, 766, 776, 287, 515, 591, 785, 791, 910; 437/70, 29, 42, 244

(56) References Cited

U.S. PATENT DOCUMENTS

| 5,268,311 | * | 12/1993 | Euen et al. | 438/515 |
| 5,534,460 | | 7/1996 | Tseng et al. | 438/672 |
| 5,643,825 | * | 7/1997 | Gardner et al. | 437/70 |
| 6,015,739 | * | 1/2000 | Gardner et al. | 438/287 |

* cited by examiner

*Primary Examiner*—David Nelms
*Assistant Examiner*—Phuc T. Dang

(57) ABSTRACT

A method for forming a dielectric layer with a low dielectric constant (low-k) is described. A semiconductor substrate is provided. A dielectric layer is formed on the substrate. A doping step is performed on the dielectric layer. An annealing step is performed and a gas is simultaneously fed so that the dielectric layer is converted into the low-k dielectric layer.

19 Claims, 1 Drawing Sheet

METHOD OF FORMING DIELECTRIC LAYER WITH LOW DIELECTRIC CONSTANT

BACKGROUND OF THE INVENTION

1. Field of Invention

The present invention relates to a method for forming a semiconductor device. More particularly, the present invention relates to a method for forming a dielectric layer with a low dielectric constant (low-k).

2. Description of Related Art

In the current process of very large scale integration (VLSI), more than two metal layers are fabricated to satisfy the integration requirements. This is called multilevel interconnect. With the increase of integration and the shrinking device size in integrated circuits (IC), metal lines are increasingly closer so that an increasingly serious capacitance effect is induced between the two metal lines. As a result, the crosstalk between conductors and impedance in the circuit structure are increasingly serious so as to increase resistance capacitance time delay. Thus the circuit performance is degraded.

The resistance of conductive lines and a parasitic capacitance are crucial factors to affect the performance. Commonly one resolution is to choose metal material with a low resistance to reduce the resistance between the conductive lines. Another resolution is use of dielectrics with a low dielectric constant (low-k) to reduce the parasitic capacitance.

In the conventional art, a silicon oxide layer is formed between metal lines to serve as a dielectric layer. The method for forming the silicon oxide layer includes high density plasma chemical vapor deposition (HDP-CVD), or plasma enhanced chemical vapor deposition (PECVD) using tetra-ethyl-ortho-silicate (TEOS) as gas source. The dielectric constant of the silicon oxide layer is about 4.1. However, the dielectric constant 4.1 of the dielectric layer is not sufficient for use at the sub-half micro level of fabrication. As a result, a parasitic capacitance induced between conductive lines becomes more serious so as to increase a RC time delay, and reduce the performance.

SUMMARY OF THE INVENTION

The invention provides a method for forming a dielectric layer with a low dielectric constant (low-k). A method for forming a dielectric layer with a low dielectric constant (low-k) is described. A semiconductor substrate is provided. A first dielectric layer is formed on the substrate. A doping step is performed on the dielectric layer. An annealing step is performed and a gas is simultaneously fed so that the first dielectric layer is converted into the low-k dielectric layer. The method further comprises forming a second dielectric layer on the substrate before the first dielectric layer is formed and forming a third dielectric layer on the low-k dielectric layer.

Accordingly, the present invention provides a method for forming a dielectric layer with a low dielectric constant (low-k). The method forms a low-k dielectric layer to reduce a parasitic capacitance induced between conductive lines, efficiently insulate the metal lines and reduce the RC time delay. The invention is simple and economical.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
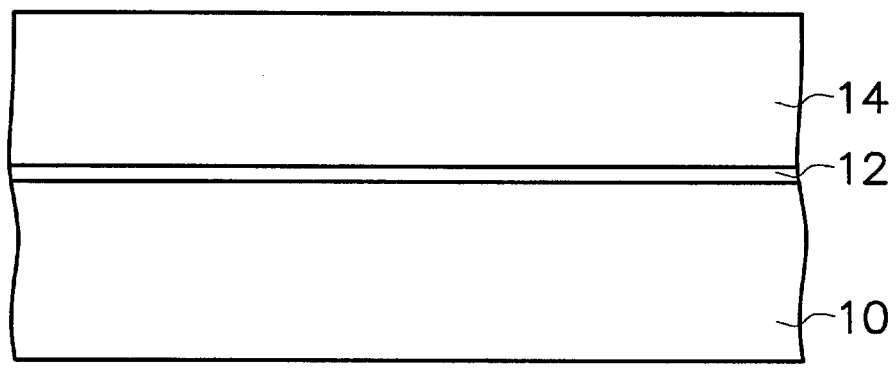
FIGS. 1A through 1C are schematic, cross-sectional views showing a method for forming a dielectric layer with a low dielectric constant according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
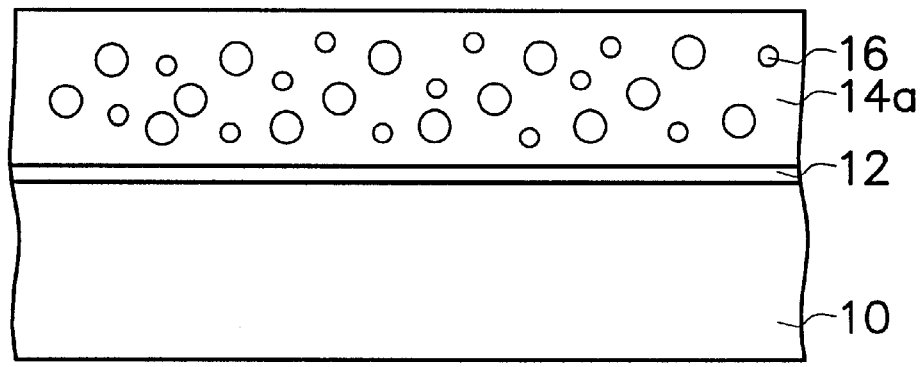
Figure 1C:
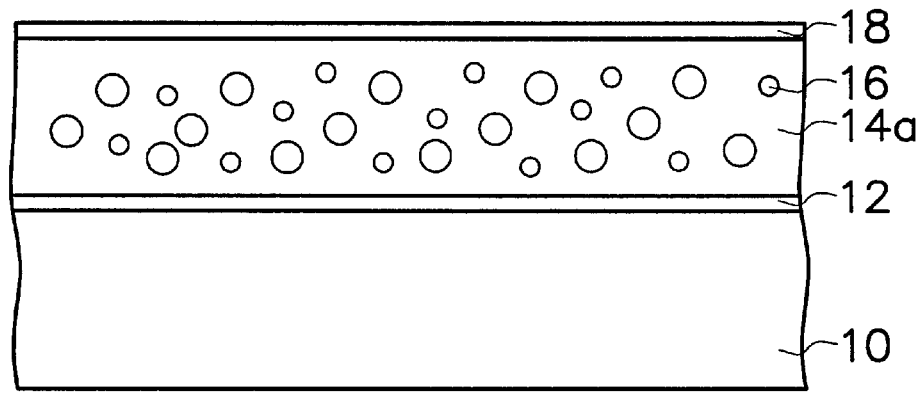

FIGS. 1A through 1C are schematic, cross-sectional views showing a method for forming a dielectric layer with a low dielectric constant (low-k) according to one preferred embodiment of this invention.

Referring to FIG. 1A, a semiconductor substrate 10 is provided. The substrate 10 includes preformed semiconductor devices such as a metal oxide semiconductor (MOS) transistor (not shown). The substrate 10 further comprises a metal interconnect (not shown). A dielectric layer 12 is formed on the substrate 10 by, for example, chemical vapor deposition (CVD). The dielectric layer 12 includes, for example, silicon oxide. The dielectric layer 12 is formed to protect a dielectric layer with a low dielectric constant (low-k) subsequently formed on the dielectric layer 12. The subsequently formed low-k dielectric layer is not compact; therefore, an adjacent metal layer such as the metal interconnect easily enters into the low-k dielectric layer, leading to a poison phenomenon. Another dielectric layer 14 is formed on the dielectric layer 12. The method for forming the dielectric layer 14 includes forming a silicon oxide layer by high-density plasma CVD (HDP-CVD), or by plasma-enhanced CVD (PECVD) with tetra-ethyl-ortho-silicate (TEOS) serving as a gas source.

Referring to FIG. 1B, a doping step is performed on the insulating layer 14 (FIG. 1A). The doping step includes, for example, ion implantation. The dopant can be $CF_4$, $CClF_3$, $CCl_3F_2$, or $CCl_3F$. The energy ranges from approximately 100 to 300 KeV. The dosage of the dopant ranges from approximately 1E14 to 1E16 ions/cm$^{2.}$ Still referring to FIG. 1B, an annealing step is performed, and a gas is simultaneously fed so that a reaction occurs in the dielectric layer 14 (FIG. 1A), and the dielectric layer 14 is converted into a porous low-k dielectric layer 14a. The gas includes, for example, oxygen gas. The dopant in the dielectric layer 14 (FIG. 1A), and the dielectric layer 14 of silicon dioxide react with oxygen to convert into a SiOF layer and outgas $CO_2$ gas in the dielectric layer 14a. SiOF has a lower dielectric constant than the silicon oxide layer, and the dielectric constant of SiOF is about 3.5. Moreover, $CO_2$ gas is outgassed from the dielectric layer 14a. Therefore, the dielectric layer 14a has a lower dielectric constant than that of the SiOF layer. The dielectric constant of the dielectric layer 14a is about 2.5. The annealing step is performed at from about 300 to about 400° C. An excessively high temperature is avoided because such a high temperature would affect the metal interconnect on the substrate 10. For example, an excessively operating temperature causes the aluminum in the metal interconnect to melt.

In this step, the dielectric layer 14 (FIG. 1A) of silicon oxide is converted into the porous low-k dielectric layer 14a of SiOF. Thus the invention can reduce a parasitic capacitance induced between conductive lines, efficiently insulate the metal lines and reduce the RC time delay.

Referring to FIG. 1C, another dielectric layer 18 is formed on the dielectric layer 14a by, for example, CVD. The dielectric layer 18 includes, for example, silicon oxide. The dielectric layer 18 serving as a cap layer protects the porous dielectric layer 14a. Additionally, the dielectric layer 18 can provide better adhesion between the dielectric layer 14a and a subsequently formed metal layer. Moreover, the resistance to a subsequent annealing step is thus increased. Therefore, a poison phenomenon resulting from metal diffusing into the dielectric layer can be avoided.

In addition, the another ion implantation method is to control the depth doped into the dielectric layer 14 with ions. The depth is preferably two thirds of the dielectric layer 14. Then an annealing step is performed and a gas such as oxygen is simultaneously fed so that a reaction occurs in the dielectric layer 14. Since two-thirds of the dielectric layer 14 is doped with the ions, only the upper dielectric layer 14 is converted into a porous low-k dielectric layer 14a. The remaining one third of the dielectric layer 14 is still silicon oxide. By this method, the dielectric layer 12 is not necessarily formed because the unreacted dielectric layer 14 has the same protection function as the dielectric layer 12.

The invention forms a low-k dielectric layer to efficiently insulate the metal lines and reduce the RC time delay. The dielectric layers are respectively formed before and after the low-k dielectric layer is formed so as to prevent metal from entering into the low-k dielectric layer. The invention converts a conventionally used silicon oxide layer into a low-k dielectrics. The method is simple and economical.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a dielectric layer with a low dielectric constant (low-k), comprising:
   providing a semiconductor substrate;
   forming a first dielectric layer on the substrate;
   performing a doping step on the first dielectric layer, wherein the first dielectric layer is doped with an ion comprising $CF_4$, $CClF_3$, $CCl_2F_2$, $CCl_3F$; and
   performing an annealing step while simultaneously feeding a gas so that the first dielectric layer is converted into the low-k dielectric layer.

2. The method according to claim 1, wherein the first dielectric layer comprises silicon oxide layer.

3. The method according to claim 1, wherein the first dielectric layer is formed by chemical vapor deposition.

4. The method according to claim 1, wherein the doping step comprises an ion implantation step using the ion as a dopant.

5. The method according to claim 4, wherein the ion is chosen from a group consisting of $CF_4$, $CClF_3$, $CCl_2F_2$, and $CCl_3F$.

6. The method according to claim 4, wherein the ion implantation step is performed using an energy ranging from approximately 100 to 300 KeV.

7. The method according to claim 4, wherein a dosage of the ions ranges from approximately 1E14 to 1E16 ions/$cm^2$.

8. The method according to claim 1, wherein the annealing step is performed at a temperature ranges from approximately 300 to 400° C.

9. The method according to claim 1, wherein the gas comprises oxygen.

10. The method according to claim 1, the method further comprising forming a second dielectric layer on the substrate before the first dielectric layer is formed.

11. The method according to claim 1, the method further comprising forming a third dielectric layer on the low-k dielectric layer.

12. A method for forming a dielectric layer with a low dielectric constant (low-k), comprising:
    providing a semiconductor substrate;
    forming a dielectric layer on the substrate;
    performing a doping step on the dielectric layer, so that the dielectric layer is doped with an ion selected from a group consisting of $CF_4$, $CClF_3$, $CCl_2F_2$, or $CCl_3F$; and
    performing an annealing step and simultaneously feeding a gas so that a part of the dielectric layer is converted into the low-k dielectric layer.

13. The method according to claim 12, wherein the dielectric layer comprises silicon oxide layer.

14. The method according to claim 12, wherein the doping step comprises an ion implantation step using the ion as a dopant.

15. The method according to claim 14, wherein the ion is chosen from a group consisting of $CF_4$, $CClF_3$, $CCl_2F_2$, and $CCl_3F$.

16. The method according to claim 14, wherein the ion is doped in a depth of about two thirds of the dielectric layer.

17. The method according to claim 12, wherein the annealing step is performed at a temperature ranging from approximately 300 to 400° C.

18. The method according to claim 12, wherein the gas comprises oxygen.

19. A method for forming a dielectric layer with a low dielectric constant (low-k), comprising:
    providing a semiconductor substrate;
    forming a dielectric layer on the substrate;
    partially doping the dielectric layer with an ion chosen from a group consisting of $CF_4$, $CClF_3$, $CCl_2F_2$, or $CCl_3F$; and
    performing an annealing step simultaneously fed with an oxygen gas after the step of partially doping the dielectric layer, so that a part of the dielectric layer is converted into the low-k dielectric layer.

* * * * *